United States Patent [19]
Shiozaki et al.

[11] Patent Number: 6,136,162
[45] Date of Patent: Oct. 24, 2000

[54] METHOD AND APPARATUS FOR DEPOSITING ZINC OXIDE FILM AND METHOD FOR PRODUCING PHOTOELECTRIC CONVERTER DEVICE

[75] Inventors: Atsushi Shiozaki, Kyoto; Ako Omata, Saitama-ken; Yumi Yoshida, Yokohama, all of Japan

[73] Assignee: Canon Kabushiki Kaisha, Tokyo, Japan

[21] Appl. No.: 09/251,301

[22] Filed: Feb. 17, 1999

[30] Foreign Application Priority Data

Feb. 17, 1998 [JP] Japan .................................. 10-033457
Feb. 15, 1999 [JP] Japan .................................. 11-035462

[51] Int. Cl.$^7$ ........................... C23C 14/35; H01L 31/04; H01L 31/18
[52] U.S. Cl. ................................. 204/192.29; 204/192.1; 204/192.12; 204/298.13; 204/298.16; 204/298.19; 204/298.17; 136/256; 136/252; 136/265; 257/431; 257/433; 257/434; 427/571; 428/702; 438/57; 438/69; 438/85
[58] Field of Search .......................... 204/192.1, 192.29, 204/192.12, 298.13, 298.16, 298.19, 298.17; 136/256, 252, 265; 257/431, 433, 434; 427/571; 428/702; 438/57, 69, 85

[56] References Cited

U.S. PATENT DOCUMENTS

| | | |
|---|---|---|
| 4,309,266 | 1/1982 | Nakamura et al. ................. 204/192.12 |
| 4,419,533 | 12/1983 | Czubatyj et al. ........................ 136/259 |
| 4,428,810 | 1/1984 | Webb et al. ........................ 204/192.29 |
| 4,532,372 | 7/1985 | Nath et al. ................................ 136/256 |
| 5,180,476 | 1/1993 | Ishibashi et al. .................. 204/192.29 |
| 5,453,135 | 9/1995 | Nakagawa et al. ................ 204/192.29 |
| 5,736,267 | 4/1998 | Mitsui et al. ............................ 428/702 |

FOREIGN PATENT DOCUMENTS

| | | |
|---|---|---|
| 5-44029 | 2/1993 | Japan . |
| 6-2130 | 1/1994 | Japan . |
| 6-116722 | 4/1994 | Japan . |
| 7-126847 | 5/1995 | Japan . |
| 8-111123 | 4/1996 | Japan . |
| 9-87833 | 3/1997 | Japan . |

*Primary Examiner*—Alan Diamond
*Attorney, Agent, or Firm*—Fitzpatrick, Cella, Harper & Scinto

[57] ABSTRACT

A deposition method is adapted to deposit a zinc oxide film that has a high light transmittance, an adequate specific electric resistance and a large thickness at a high deposition rate and at low cost in a process that may last long but is stable. The method for depositing a zinc oxide film on a substrate held in an inert gas atmosphere is conducted by magnetron sputtering so that the maximum magnetic flux density in a direction parallel to the surface of the zinc oxide target is held to be not higher than 350 gauss.

12 Claims, 3 Drawing Sheets

METHOD AND APPARATUS FOR DEPOSITING ZINC OXIDE FILM AND METHOD FOR PRODUCING PHOTOELECTRIC CONVERTER DEVICE

BACKGROUND OF THE INVENTION

1. Field of the Invention

This invention relates to a method for depositing a zinc oxide film which can be used as a transparent electroconductive film on the rear surface of a photoelectric converter as well as to an apparatus to be used with such a method.

2. Related Background Art

Various photoelectric converters utilizing thin film semiconductors made of amorphous silicon or fine crystal silicon have been developed in recent years, including those in which light passed through a semiconductor layer is reflected and absorbed again by the same semiconductor layer.

Known photoelectric converters also include those having a transparent electroconductive film typically made of metal oxide between a semiconductor layer and a reflective layer and those having an undulation structure (texture structure) on the surface of the reflective layer and/or the transparent electroconductive film for extending the light path in the reflective layer.

U.S. Pat. No. 4,419,533 discloses a technique of arranging a barrier layer typically made of zinc oxide in order to prevent the material of the reflective layer from diffusing into the semiconductor layer. U.S. Pat. No. 4,532,372 discloses a technique of forming a transparent resistive layer on the reflective layer in order to prevent any short-circuiting due to the defects in the semiconductor layer.

Japanese Patent Application Laid-Open No. 6-116722 describes a deposition method of sequentially forming a metal layer and a transparent resistive layer by sputtering, while moving a long substrate, in a continuous process as well as an apparatus that can suitably be used with such a method.

Apart from photoelectric converters, sputtering is popularly used for depositing zinc oxide film, and various techniques have been proposed to improve the light transmittance, electric conductivity and the stability of electric discharge. For example, Japanese Patent Application Laid-Open Nos. 6-2130 and 8-111123 disclose respective methods of adding another element to a zinc oxide target.

In the field of magnetron sputtering, which is not limited to deposition of zinc oxide film, Japanese Patent Application Laid-Open Nos. 5-44029 and 7-126847 describe respective methods for improving the target efficiency by defining a specific magnetic field on the surface of the target.

When using zinc oxide film for a transparent electroconductive film, the film is required to have a high light transmittance. While the electric conductivity of such a film is preferably low in many cases, the film may sometimes be required to have a low specific electric resistance. Other requirements for such a film include a high deposition rate, a stable deposition process and a high productivity.

Particularly, a transparent resistive film arranged between the reflective layer and the semiconductor layer of a photoelectric converter for the purpose of prevention of diffusion and short-circuiting is required to have a high light transmittance and a substantially high specific electric resistance. Importantly, it is also required to have a certain thickness and has to be steadily prepared at low cost for a long period.

To date, the specific electric resistance of a sputtering target made of highly pure zinc oxide is relatively high and hence gives rise to abnormal discharges involving arc discharges when fed with large electric power in a known DC sputtering process so that it can not give stable electric discharges. Generally speaking, the specific electric resistance of a target of highly pure zinc oxide is about 0.01 $\Omega \cdot cm$ at the lowest in a hot press process or in a cold press process selectively using a binder.

In recent years, various proposals have been made to realize a stable electric discharge by adding aluminum, silicon, boron or gallium to the zinc oxide of the target in order to reduce the electric resistance of the target. However, such additives can reduce the light transmittance to such an extent that the photoelectric converter comprising the zinc oxide is no longer feasible because a high light transmittance is vital to the photoelectric converter.

Thus, to date, the target is forced to have a relatively low specific electric resistance and to be fed with DC power at a relatively low rate at the cost of a low deposition rate, a poor productivity and a large deposition system.

SUMMARY OF THE INVENTION

Therefore, it is the object of the present invention to provide a method for depositing a zinc oxide film that has a high light transmittance, an adequate specific electric resistance and a thick film which is steadily prepared at a high deposition rate and at low cost for a long period, as well as an apparatus to be used with such a method.

It is a further object of the present invention to provide a photoelectric device comprising a zinc oxide film prepared by a method according to the present invention.

According to the invention, the above object is achieved by providing a method for depositing a zinc oxide film on a substrate held in an inert gas atmosphere by magnetron sputtering, the maximum magnetic flux density in a direction parallel to the surface of the zinc oxide target being held to be not higher than 350 gauss.

Preferably, the ratio of the distance D between the surface of the magnet and that of the target to the distance L between the magnetic poles of the magnet, or D/L, is held to be not greater than 1.0.

Preferably, the magnet circuit is so configured as to generate a plurality of closed loops in the magnetic field on the surface of the single target and the magnet circuit is reciprocatively driven along the surface of the target.

Preferably, the specific electric distance of the zinc oxide target is not larger than 0.1 $\Omega \cdot cm$, and the purity is not less than 99% by weight.

According to the invention, there is also provided an apparatus for depositing a zinc oxide film comprising a target to be shot by plasma ions for sputtering in an inert gas atmosphere and a magnet circuit for applying a closed loop magnetic field to the surface of the target, the target being made of zinc oxide with a specific resistance of not greater than 0.1 $\Omega \cdot cm$ and a purity of not less than 99% by weight, the maxium magnetic flux density in a direction parallel to the surface of the zinc oxide target being held to be not higher than 350 gauss.

Preferably, the ratio of the distance D between the surface of the magnet and that of the target to the distance L between the magnetic poles of the magnet, or D/L, is held to be not greater than 1.0.

Preferably, the magnet circuit is so configured as to generate a plurality of closed loops in the magnetic field on the surface of the single target and the apparatus further comprises a driving part for reciprocatively driving the magnet circuit along the surface of the target.

Preferably, an apparatus for depositing a zinc oxide film according to the invention is configured as a roll-to-roll type apparatus wherein film depositing is conducted continuously while a substrate in the form of a band plate is moved between the rolls. Still preferably, the zinc oxide target has a specific resistance not greater than 0.1 Ω·cm and/or a purity of not less than 99% by weight.

The effects of a novel method for depositing a zinc oxide film and those of a novel apparatus to be used with such a method will be described hereinafter in greater detail.

With a method for depositing a zinc oxide film on a substrate held in an inert gas atmosphere by magnetron sputtering according to the invention, it is now possible to realize a deposition rate of not lower than 50 Å/sec with only about 10 W/cm² of DC power when the maximum magnetic flux density in a direction parallel to the surface of the zinc oxide target is held to be not higher than 350 gauss.

Preferably, the ratio of the distance D between the surface of the magnet and that of the target to the distance L between the magnetic poles of the magnet, or D/L, is held to be not greater than 1.0. If the distance L between the magnetic poles is smaller than the distance between the surface of the target and that of the magnet, the magnetic flux density around the line connecting the magnetic poles is raised, while the magnetic flux density in areas remote from the surface of the target is reduced to make it impossible to sustain electric discharge.

When the magnet circuit is so configured as to generate a plurality of closed loops in the magnetic field on the surface of the single target and the apparatus further comprises a driving part for reciprocatively driving the magnet circuit along the surface of the target, the target efficiency can be dramatically improved.

DESCRIPTION OF THE PREFERRED EMBODIMENT

Now, a method for depositing a zinc oxide film and an apparatus to be used with such a method according to the present invention will be described by referring to the accompanying drawings that illustrate, in a non-limiting manner, a preferred embodiment of the invention.

Figure 1A:
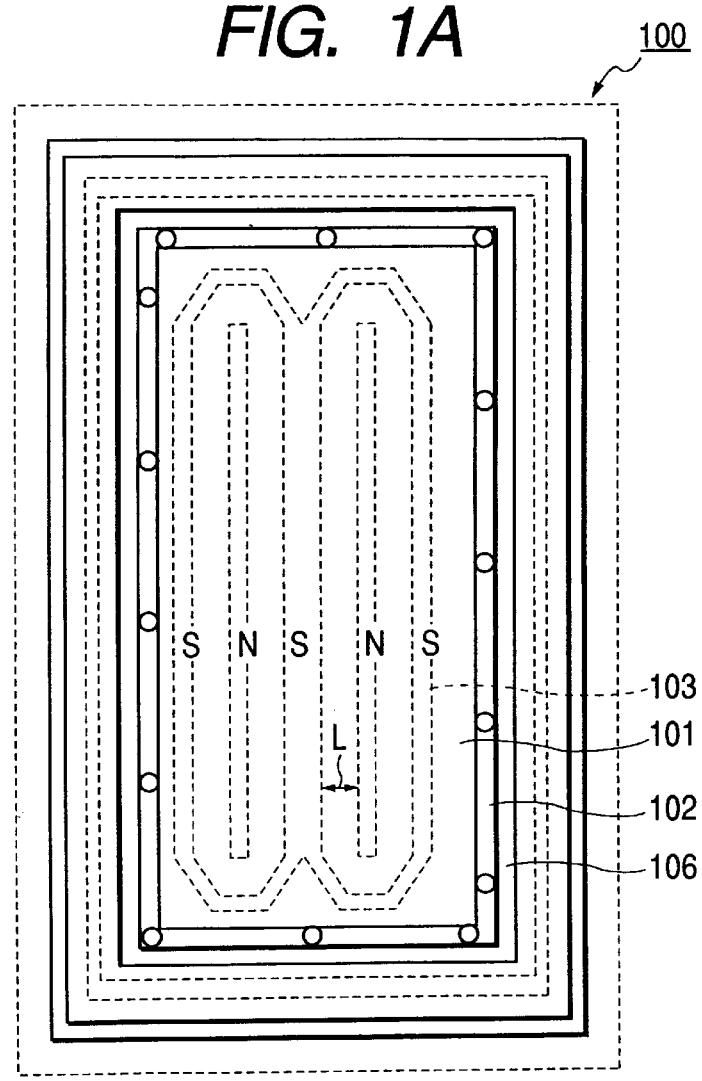
FIGS. 1A and 1B are schematic views of an embodiment of apparatus for depositing a zinc oxide film according to the invention.
Figure 1B:
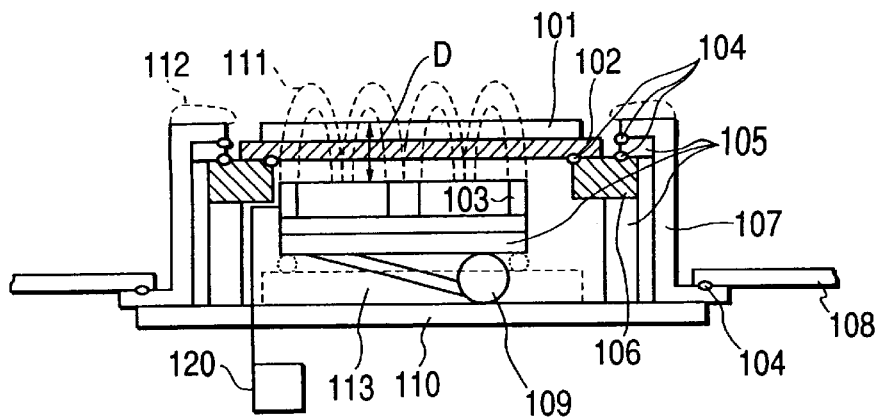

FIGS. 1A and 1B schematically illustrate an embodiment of apparatus for depositing a zinc oxide film according to the invention, of which FIG. 1A is a plan view and FIG. 1B is a front view schematically showing the inside thereof.

Referring to FIGS. 1A and 1B, there are shown a target 101 of sputtering and a packing plate (retaining means) 102 for reinforcing the target. There are also shown a magnet circuit 103, driving part 109 of the magnet circuit and a rail 113. The magnet circuit 103 will be oscillated by the driving part 109. A line 111 denotes a line of the magnetic force generated between the magnetic poles of the magnet circuit. There are also shown vacuum seals 104, insulating members 105, an electroconductive member 106, support members 107 and 110, electrically arranged device wall 108 and a grounding shield 112 for preventing any objects other than the target from being sputtered. A control means 120 is provided to control the magnetic force in the apparatus in such a way that the magnetic flux density in any direction parallel to the surface of the target does not exceed 350 gauss during the operation of depositing a zinc oxide film.

In other words, the depositing apparatus of the embodiment according to the invention comprises a cathode unit 100 including the packing plate and the magnet circuit as well as other components and the target, and is placed in the vacuum container of a sputtering system as will be described in greater detail hereinafter.

Zinc oxide typically with a specific resistance not greater than 0.1 Ω·cm and a purity of not less than 99% by weight is used for the target 101. Abnormal electric discharges can appear to make it impossible to sustain a stable glow discharge when the specific resistance exceeds 0.1 Ω·cm. When, on the other hand, aluminum or some other element is added to the zinc oxide, highly pure zinc oxide with a purity of greater than 99% by weight is preferably used for the target in order to lower the specific resistance and maintain the high light transmittance.

For the purpose of the invention, the maximum magnetic flux density of the magnetic field 111 that is generated by the magnet circuit 103 is held to be not higher than 350 gauss at the surface of the zinc oxide target and in a direction parallel to the surface of the target. This objective can be achieved by controlling the residual magnetic force of the magnet, the distance L between the magnetic poles and the distance D between the surface of the target and that of the magnet by the control means 120.

In order to sustain a stable electric discharge, the distance D between the surface of the target and that of the magnet is preferably reduced. Then, a magnet having a small residual magnetic force may be used for the purpose of the invention.

On the other hand, the distance D is preferably greater than the combined thickness of the target 101 and the packing plate 102 carrying the target. Then, a relatively thick target 101 may be used to reduce the frequency of replacing the target and, additionally, a relatively thick and hence mechanically strong packing plate 102 may be used.

The relationship between the distance L between the magnetic poles and the distance D between the surface of the target and that of the magnet may be selected so that it can sustain a high magnetic flux density in areas remote from the surface of the target and hence a stable overall electric discharge. A commercially available magnet may be employed for the apparatus to reduce the manufacturing cost. If the distance L between the magnetic poles is made smaller than the distance D between the surface of the target and that of the magnet, the magnetic flux density around the line connecting the magnetic poles is raised, while the magnetic flux density in areas remote from the surface of the target is reduced to make it impossible to sustain electric discharge. If, on the other hand, the distance L is made greater by far than the distance D, a strong magnet will have to be employed, requiring by turn the use of a broad target 101. Thus, an appropriate distance has to be selected for the distance L.

For the purpose of the invention, an effective electric discharge can be sustained under low pressure and also a deposited film may be produced with a short operating time when the magnetic flux density on the surface of the target is held to be not lower than about 200 gauss.

Additionally, a closed loop has to be generated in the magnetic field on the surface of the target in order to confine drifting electrons within a certain region. Meanwhile, the target has to be eroded by sputtering over a large surface area to realize a high deposition rate. The eroded area of the surface of the target can be increased when a plurality of closed loops are generated on the surface. Then, the distance L between the magnetic poles that is otherwise minimized will have to be determined appropriately as the number of closed loops in the magnetic field increases relative to the width of the target.

Taking the above factors into consideration, it is advantageous for the purpose of the invention that the residual magnetic force of the magnet is found between 1,500 and 3,000 gauss and the distance L between the magnetic poles is between 25 and 50 mm, while the distance D between the surface of the target and that of the magnet is between 20 and 40 mm to make the ratio of the distance D between the surface of the target and that of the magnet to the distance L between the magnetic poles, or D/L, preferably not greater than 1.0. While the magnet may be box-shaped, it may alternatively have inclined end surfaces.

The target 101 will be eroded by sputtering and the erosion will be centered at a spot where the magnetic flux density is maximum in a direction parallel to the surface of the target. A motor and a crank mechanism 109 as shown in FIG. 1B may be used to reciprocatively and laterally drive the magnet circuit 103 on the rail 113 to evenly erode the target 101 in order to improve the target efficiency.

Figure 2A:
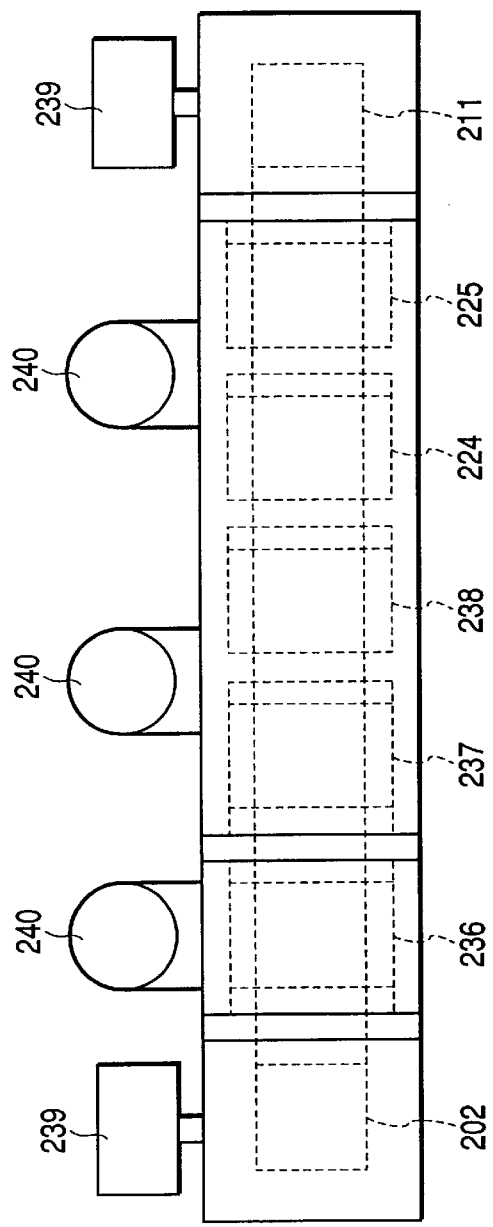
FIGS. 2A and 2B are schematic views of a DC sputtering system that can be used for the purpose of the invention.
Figure 2B:
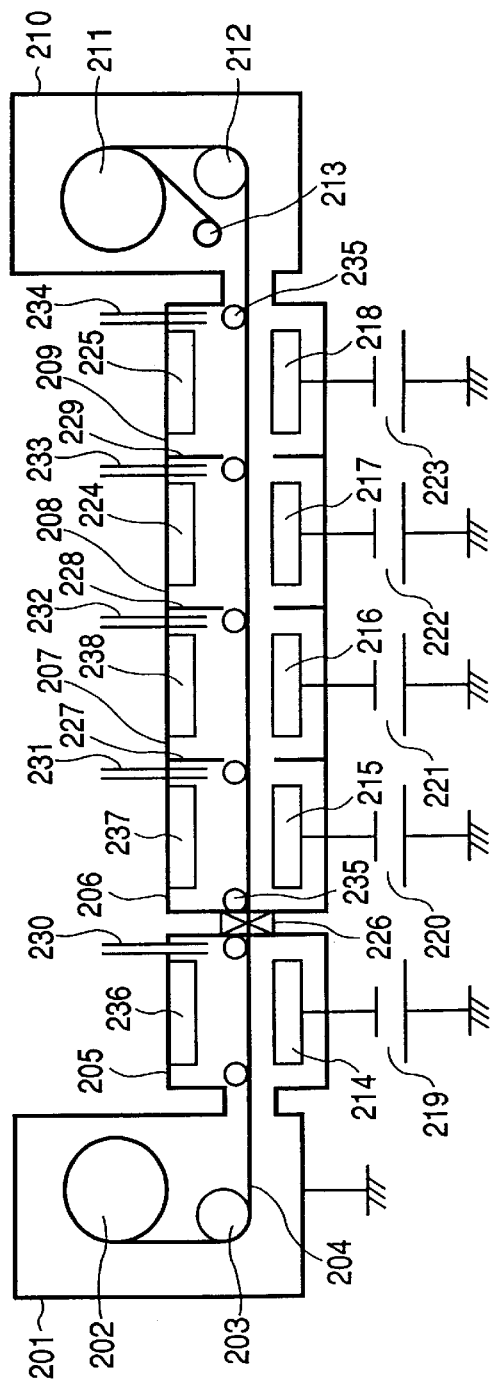

FIGS. 2A and 2B schematically illustrate a DC magnetron sputtering system that can be used for the purpose of the invention, of which FIG. 2B is a sectional view and FIG. 2A is a front view schematically showing the inside. Referring to FIGS. 2A and 2B, there is shown a roll of substrate 202 arranged in a feed chamber 201, a substrate 204 denoting a substrate being fed out of the roll and taken up by a take-up roll 211 in a take-up chamber 210 by way of a guide roller 203, a magnet roller 235 and a steering roller 212. The substrate 204 passes through a reflectve layer forming chamber 205, active oxygen treatment chambers 206, 207, and transparent resistive layer forming chambers 208, 209 in this order, as it travels. Each of the chambers is evacuated by means of a vacuum pump 239 and a diffusion pump 240. Additionally, each of the chambers is provided with a section disposed thereon for securing a cathode unit 100 as shown in FIG. 1A. The device wall 108 shown in FIG. 1B corresponds to the top wall of each of the chambers. Reference numeral 213 denotes a roll for a protective film which is fed to the take-up roll 211.

In FIG. 2B, reference numeral 214 denotes a target for the reflective layer and reference numerals 215 and 216 respectively denote cathodes for glow discharge, whereas reference numerals 217 and 218 respectively denote targets for the transparent resistive layer and reference numerals 219 through 232 respectively denote DC sources. Furthermore, there are shown substrate heaters 224, 225 and 236, a gas gate 226, partition panels 227, 228 and 229, gas inlet pipes 230 through 234, preheaters 237 and 238, a vacuum pump 239 and a diffusion pump 240.

The cathode unit 100 wherein the target 101 is installed to generate a magnetic field 111 with the above described profile may be arranged in a vacuum system having the substrate 204 therein in such a way that the cathode unit 100 may replace a plurality of similar cathode units 215 through 218 as shown in FIG. 2B. The entire vacuum system is evacuated and inert gas such as argon is supplied into it through gas feed pipes 231 through 234 in order to maintain the internal pressure to a level between 1.5 mtorr and 75 mtorr. A sputtering operation can be carried out under this condition by feeding the target 101 with DC power not exceeding 10 Wcm/cm² from the electroconductive support member 106 that is insulated by insulating members 105 by way of the packing plate 102.

Thus, with a method according to the invention, it is now possible to deposit a zinc oxide film that steadily maintains a high light transmittance for a long period and has an adequate specific electric resistance. The deposition can be carried out at a deposition rate higher than 50 Å/sec with only about 10 W/cm² of DC power supply at low cost, wherein less unusual discharge is observed without any interruption in discharge.

Note, however, a DC power supply rate of about 4 W/cm² will be required to achieve a deposition rate higher than 50 Å/sec.

The pressure in the chamber, while the electric discharge is carried out, may be selected appropriately by taking the circumstances into consideration. A low pressure level may be selected to effectively prevent abnormal electric discharges, whereas a high pressure level may be desirable for achieving a uniform longitudinal distribution of the deposition rate. The longitudinal distribution of deposition rate can be improved by appropriately selecting the direction of exhaustion and the position for supplying inert gas. Gas may be supplied evenly over the entire surface of the target when an appropriately bored gas feed pipe is arranged around the target 101.

EXAMPLE 1

In Example 1, a zinc oxide film was deposited on a substrate in a system as shown in FIGS. 2A and 2B, using a plurality of cathode units 100 having a configuration shown in FIGS. 1A and 1B. A hot pressed zinc oxide target with dimensions of 25.4 cm×50.8 cm×8.5 mm available from Mitsui Mining and Smelting was used for the target 101.

The resistance of the surface of the target was observed by means of a 4-probe method, using probes arranged at regular intervals of 1 mm, to find it to be equal to 0.1Ω. The specific resistance was estimated to be 0.063 Ω·cm by using the known formula of $\rho=2\pi d \cdot \Delta V/I$ (where $\rho$ is the specific resistance of the surface, d is the interval of probe arrangement, $\Delta V$ is the voltage between the probes and I is the supply current). The density was 5.2 g/cm³ to prove a packing ratio of about 90% relative to the crystal density of 5.78 g/cm³. The purity was 99.99% by weight, the balance being impurities including Fe, Pb and Cd.

The target 101 was bonded to a packing plate 102 having a thickness of 13.5 mm and made of oxygen-free copper and then arranged on an electroconductive support member connected to a DC source in a manner as shown in FIGS. 1A and 1B.

Specifically, the packing plate 102 was prepared by bonding a plate provided with grooves, each being 32 mm wide and 4 mm deep, and a plate provided with cooling water inlet and outlet bores by means of electron beam welding so that cooling water could flow therethrough. Thus, both the magnet circuit 103 and the driving part 109 could enjoy a long service life as they were relieved of being dipped into cooling water.

The vacuum seals 104 were arranged independently from the cooling water seals to make the former free from the pressure of cooling water and improve the reliability of the entire system. O-rings available from Byton were used for the vacuum seals. Insulating members 105 were made of Teflon or epoxy resin for effective insulation. Besides, other constructions can be used.

The magnet circuit 103 was available from TDK Co., Ltd., wherein the magnetic poles were separated by distance L of 29 mm and the residual magnetic force was about 2,000 gauss. The circuit had dimensions of 48 cm×18 cm×35 mm (wherein the inner magnet was 26 mm high and the bottom yoke was 9 mm high). A pair of closed loops were formed in the magnetic field on the surface of the target.

The magnet and the device wall 108 were electrically insulated from each other. The surface of the magnet and the packing plate were separated by a gap of 1 mm in order to prevent them from physically contacting each other. Thus, the distance D between the surface of the magnet and that of the target was 23 mm to make D/L equal to 0.79.

Then, the magnetic flux density in a direction parallel to the surface of the target was observed by means of a magnetometer using Hall elements to find that the highest magnetic flux density on the surface of the target was about 240 gauss.

A number of identical cathode units 100 were then arranged in the system shown in FIGS. 2A and 2B and denoted by 215 through 218 respectively. A roll of belt-like stainless steel (SUS430) having the surface treated with bright annealing, which was 356 mm wide and 0.15 mm thick, was suspended between the feed chamber 201 and the take-up chamber 210 as substrate 204 and all the vacuum containers were closed by means of the respective closures. The substrate 204 was grounded along with the chamber walls by way of various support members.

Subsequently, the system was evacuated by means of vacuum pumps 239, 240 until the internal pressure fell below 0.075 mtorr. Thereafter, inert argon gas was fed to the reflective layer forming chamber 205 and the zinc oxide film forming chambers 206 through 209 by way of the respective gas feed pipes 230 through 234 by 50 sccm per each chamber. Under this condition, the opening of the exhaust valve was regulated to maintain the internal pressure of the vacuum chambers to 2.2 mtorr.

Heater units 236 through 238, 224, 225 each comprising a set of six 100 W infrared lamps, were arranged with reflector panels made of stainless steel and thermocouples were put onto the surface of the substrate 204 opposite to the one on which film was to be formed and then heated to 250° C. in a controlled manner.

Then, the servo motor was operated to drive the take-up roll 211 to rotate so that the substrate 204 was fed at a speed of 427 mm per minute.

The target 214 for forming a reflective layer was made of silver with a purity of 99.99 wt % (or aluminum can also be used) and had dimensions of 25.4 cm×50.8 cm, which target 214 was then fed with DC power at a rate of 2 kW. As a result, a silver reflective layer was deposited with a thickness of about 300 nm in about 36 seconds, during which the substrate 204 passed over the target 214.

Subsequently, the substrate 204 was sequentially moved into the zinc oxide film forming chambers 206 through 209. An MDX-10k DC power source available from Advanced Energy was used and each of the targets was fed with DC power at a rate of 8 kW (6.2 W/cm$^2$) in a current control mode. During this process, the magnet circuit 103 was reciprocatively and laterally moved in 30 cycles per minute over a distance of 30 mm on the rail 113 by means of the motor and the crank mechanism 109 in order to cause the surface of the target to be eroded uniformly.

The substrate 204 now carrying a zinc oxide film was then taken up into the take-up chamber 210. In order to avoid any damage on the surface of the zinc oxide film, a protective sheet of aluminum coated polyester film was inserted between any adjacent substrate layers as anti-static electricity measure at the time of taking up the substrate.

The above operation was continued for about 4 hours to form a reflective layer and a zinc oxide film extending over about 100 m. During this period, the electric discharge was sustained continuously so that the operation was totally free from a situation where the electric discharge was suspended without recovery. No more than 10 abnormal discharges, where the discharge voltage fell instantaneously but was restored immediately, were observed per 10 minutes throughout the 4 hours of operation to evidence that the entire operation remained very stable.

The first 10 m and the last 10 m of the substrate 204 carrying a reflective layer and a zinc oxide layer were taken and observed for the reflectivity by means of a spectro photometer at five transversally arranged points per each of the specimens to find that the reflectivity was higher than 90% at all points as determined at the center of oscillation due to an 800 nm interference.

Then, a 1 mmφ silver electrode was prepared by means of an independent electron beam evaporation system, using a metal mask having a bore of 1 mmφ, and an electric current was caused to flow between the substrate and the silver electrode. The specific resistance of the zinc oxide film across the thickness was, then, observed by measuring the voltage. The specific resistance was found to be acceptable of about 0.01 Ω·cm.

Thereafter, the zinc oxide film was partly etched in aqueous solution of acetic acid, using photoresist as an etching mask. After removing the photoresist, the resulting step was observed by a contact type film thickness meter to find that the zinc oxide layer had a film thickness of about 1±0.1 μm. This indicates that zinc oxide was deposited to a thickness of 1 μm in about 143 seconds, during which four 25.4 cm targets were moved at a speed of 427 mm per minute. In other words, the rate of deposition was about 70±7 Å/sec longitudinally over the entire substrate.

EXAMPLE 2

A roll of belt-like stainless steel (SUS430) having the surface subjected to a dull finish to show undulations on which aluminum had been deposited to a thickness of about 200 nm in another system was used as substrate in an apparatus comprising a target 101 and a number of magnet circuits 103 as in Example 1, although only zinc oxide was deposited on it and no silver deposit layer was formed. The operation was conducted under the conditions same as those described above in Example 1 to find that the electric discharge stably continued as in Example 1.

The reflectivity was rather low and found to be about 70%, probably because of the surface undulations of the substrate that scattered light. Therefore, it may be expected that the light transmittance of the zinc oxide film was the same as that of the its counterpart of the specimen in Example 1. The specific resistance was found to be 0.01 Ω·cm and no short-circuiting was observed as in Example 1. The thickness of the layer was found to be about 1 μm to prove a deposition rate substantially the same as that in Example 1, although the specimen of this example might have involved large errors in measurement due to the surface undulations of the substrate.

Figure 3:
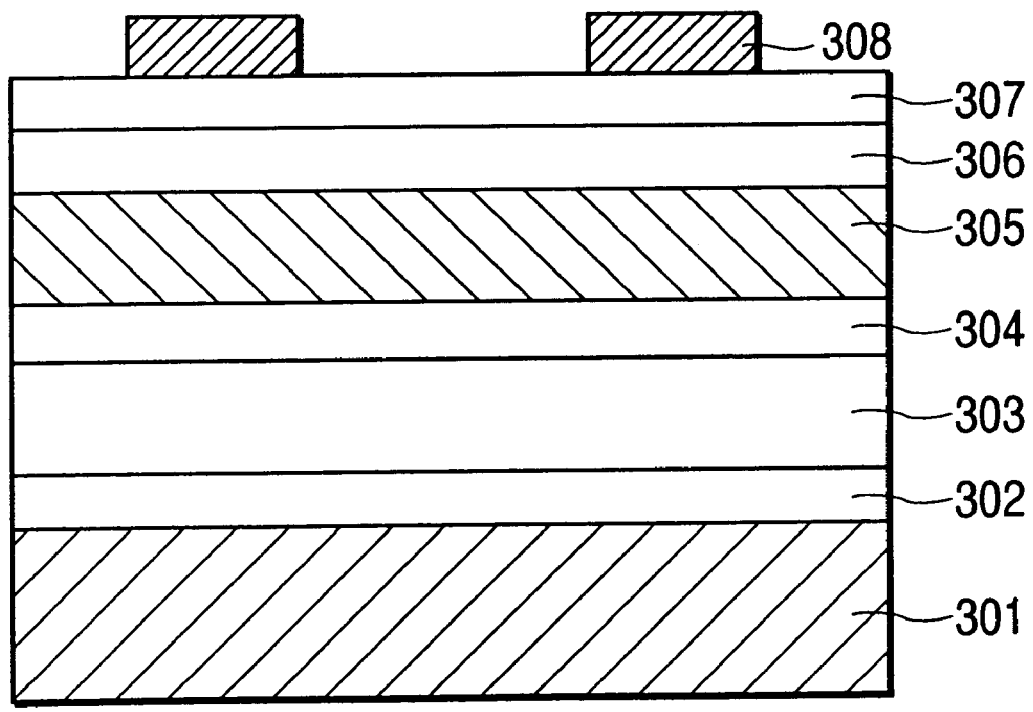
FIG. 3 is a schematic cross sectional view of a photovoltaic device.

A 5 cm×5 cm piece of specimen was cut from the substrate carrying a zinc oxide film thereon and placed in a commercially available capacity coupled high frequency CVD system to prepare a photovoltaic device. FIG. 3 schematically illustrates a photovoltaic device that can be prepared by a method according to the invention. Referring to FIG. 3, the device comprises a substrate 301, a reflective layer 302, a zinc oxide film 303, an n-type a-Si layer 304, an i-type a-Si layer 305, a p-type $\mu$C-Si layer 306, a transparent electrode 307 and a collector electrode 308. Then, the reaction vessel of the system was evacuated in two steps of coarse vacuuming and high vacuuming using the exhaust pipe of the reaction vessel. The surface temperature of the substrate was held to 250° C. by means of a temperature control system.

Upon satisfactorily completing the evacuation process, $Si_2H_6$, $PH_3/H_2$ ($H_2$ diluted to 1%) and $H_2$ were introduced into the reaction vessel by way of the gas inlet tube at respective flow rates of 1 sccm, 0.5 sccm and 40 sccm. Then the opening of the throttle valve was regulated to maintain the internal pressure of the reaction vessel at 1 torr. When the pressure was stabilized, electric power was immediately applied from a high frequency power source at a rate of 3 W. The plasma generation was sustained for 180 seconds. As a result, an n-type amorphous silicon (a-Si) layer was formed on the zinc oxide film. Such a zinc oxide layer can prevent the metal element of the reflective layer typically made of silver or aluminum from entering the n-type a-Si layer.

After evacuating the reaction vessel once again, $Si_2H_6$ and $H_2$ were introduced into the vessel by way of the gas inlet tube at respective flow rates of 40 sccm and then the opening of the throttle valve was regulated to maintain the internal pressure of the reaction vessel at 1 torr. When the pressure was stabilized, electric power was immediately applied from a high frequency power source at a rate of 2 W. The plasma generation was sustained for 600 seconds. As a result, an i-type amorphous silicon (a-Si) layer was formed on the n-type amorphous silicon (a-Si) layer.

After evacuating the reaction vessel for another time, $SiH_4/H_2$ ($H_2$ diluted to 10%), $BF_3/H_2$ ($H_2$ diluted to 1%) and $H_2$ were introduced into the reaction vessel by way of the gas inlet tube at respective flow rates of 0.5 sccm, 1 sccm and 50 sccm and then the opening of the throttle valve was regulated to maintain the internal pressure of the reaction vessel at 1 torr. When the pressure was stabilized, electric power was immediately applied from a high frequency power source at a rate of 200 W. The plasma generation was sustained for 120 seconds. As a result, a p-type micro crystalline silicon ($\mu$C-Si) layer was formed on the i-type a-Si layer.

Then, the specimen was taken out from the high frequency CVD system and fitted onto the surface of the anode of a DC magnetron sputtering system. The specimens were then shielded by a stainless steel mask arranged around the specimen and subjected to a sputtering operation in a central 4.5 cm×4.5 cm region using a target containing tin oxide and indium oxide respectively by 10 wt % and 90 wt % to obtain a transparent electrode.

The above sputtering operation was conducted to produce a 60 nm thick deposit layer in about 100 seconds under the following conditions; substrate temperature: 200° C., argon (inert gas) flow rate: 50 sccm, oxygen gas flow rate: 0.5 sccm, deposition chamber internal pressure: 3 mtorr, power supply per unit area of target: 0.2 W/cm². The desired thickness of the film deposit was obtained by the relationship between the time and the thickness previously determined through an experiment conducted in advance under the same conditions.

Then, a collector electrode was formed in a 2% area of the surface of the obtained specimen by applying silver paste by screen printing, to which an output terminal was fitted and a protective resin was bonded.

The prepared photovoltaic device was then tested for its performance by irradiating it with light having an intensity of AM1.5 (100 mW/cm²) to show an outstanding photoelectric conversion efficiency of 9%.

The specimen was then subjected to an environmental test conducted in an environmental test box at temperature of 85° C. and relative humidity of 85% for 1,000 hours. After the test, the photoelectric conversion efficiency was found to have fallen only by 0.02%, which was totally negligible.

EXAMPLE 3

In Example 3, a hot pressed zinc oxide target with dimensions of 25 cm×50 cm×6.5 mm available from Technofine was used. The target 101 showed a density of 5.2 g/cm³ and the purity was 99.9% by weight, the balance being impurities including Al, Na and Ca. The specific resistance observed on the surface of the target was 0.01 $\Omega$·cm.

The packing plate 102 was a flat plate with 10 mm thick. The room containing the magnet circuit 103 was filled with water for cooling the entire back side of the packing plate 102.

The magnet circuit 103 with dimensions 23 cm×48 cm×4 cm available from Watanuki Tech. which generates two closed loops in the magnetic field was used, wherein the distance L between the magnetic poles was 40 mm and the residual magnetic force was about 2500 gauss. Sputtering was conducted without laterally reciprocative movement of the magnet circuit 103. The height of the support member for the magnet circuit 103 was adjusted so that the distance D between the surface of the magnet and that of the target could be regulated.

In this example, D was made equal to 20 mm. The magnetic flux density in a direction parallel to the surface of the target was observed to find that the highest magnetic flux density on the surface of the target was about 300 gauss. Note that the target 101 and the magnet circuit 103 were electrically insulated from the entire system by means of members made of Teflon.

Then, a 356 mm wide substrate 204 was made to pass over a single zinc oxide target. The reflective layer was formed in another system by depositing silver (or aluminum) to a thickness of about 300 nm.

The inside of the entire system was evacuated to less than 0.075 mtorr by means of a vacuum pump and a gas feed pipe was arranged so as to entirely surround the target 101, which was then fed with argon gas at a rate of 50 sccm by way of a total of 12 holes bored through the gas feed pipe at regular intervals. The internal pressure of the vacuum chamber was held at 2.2 mtorr by regulating the exhaust valve of the system.

Then, a heater unit comprising infrared lamps was activated and the substrate was heated to 250° C. in a controlled manner by means of a thermocouple arranged in a space located on the rear side of the substrate.

Subsequently, the servo motor was operated to drive the take-up roll 211 to rotate so that the substrate 204 was fed at a speed of 143 mm per minute.

Under this condition, an MDX-10k DC power source available from Advanced Energy was used and each of the targets was fed with DC power at a rate of 10 kW (8.0 W/cm²) in a current control mode. The substrate 204 now carrying a zinc oxide film was then taken up into the take-up chamber 210 with a protective sheet inserted between any adjacent substrate layers as anti-static electricity measure at the time of taking up the substrate.

The above operation was continued for about 10 minutes to form a reflective layer and a zinc oxide film extending over about 1 m. During this period, the electric discharge was sustained continuously so that the operation was totally free from a situation where the electric discharge was suspended without recovery. No abnormal discharges, where the discharge voltage fell instantaneously but was restored immediately, were observed either to evidence that the entire operation remained very stable.

A middle portion of the substrate carrying a reflective layer and a zinc oxide layer was cut out and observed for the reflectivity by means of a spectro- photometer at five transversally arranged points per each specimen to find that the reflectivity was as high as 90% at all points as determined at the center of oscillation due to an 800 nm interference.

Then, a 1 mmφ silver electrode was prepared by means of another electron beam evaporation system, using a metal mask having a bore of 1 mmφ and an electric current was caused to flow between the substrate and the silver electrode. The specific resistance of the zinc oxide film across the thickness was, then, observed by measuring the voltage. The specific resistance was found to be acceptable at about 0.005 Ω·cm.

Thereafter, the zinc oxide film was partly etched in an aqueous solution of acetic acid, using photoresist as an etching mask. After removing the photoresist, the resulting step was observed by a contact type film thickness meter to find that the zinc oxide layer had a film thickness of about 1±0.05 μm. This indicates that zinc oxide was deposited to a thickness of 1 μm in about 113 seconds, during which a 25 cm target was moved at a speed of 133 mm per minute. In other word, the rate of deposition was about 88±5 Å/sec longitudinally over the entire substrate.

EXAMPLE 4

A zinc oxide film was formed on a flat substrate under conditions the same as those described above by referring to Example 3, except that the zinc oxide target 101 contained alumina by 3 wt % as additive.

The specific resistance of the product was observed across the thickness to find it to be satisfactory at about 0.001 Ω·cm. The rate of deposition of this example was exactly same as that of Example 3, and about 88±5 Å/sec longitudinally over the entire substrate.

Then, a middle portion of the substrate carrying a silver reflective layer and a zinc oxide layer was cut out and observed for the reflectivity by means of a spectrophotometer at five transversally arranged points per each specimen, to find that the reflectivity was about 80% at all points as determined at the center of oscillation due to an 800 nm interference.

EXAMPLE 5

A zinc oxide film was formed under the conditions the same as those described above by referring to Example 3, except that the target 101 was made of zinc oxide showing a specific resistance of 0.12 Ω·cm.

As a result, while abnormal electric discharges were observed during the process, a usable photovoltaic device could be prepared from the resulting zinc oxide film. However, the electric discharge could be suspended and the reproducibility of the quality of the film obtained was found to be lower than that of any other example.

EXAMPLE 6

A zinc oxide film was formed according to the same conditions as in Example 1, except that the magnet circuit 103 of Example 1 was modified to make the distance L between the magnetic poles equal to 27 mm, the residual magnetic force as high as about 2500 gauss, and the highest magnetic flux density on the surface of the target was made equal to 360 gauss in a direction parallel to the surface of the target.

Abnormal electric discharges occurred frequently from the very start of the electric discharge operation. While abnormal electric discharges ceased by themselves, the frequency of electric discharges could reach 10 times per minutes to make it impossible to realize a stable electric discharge.

As described above in detail, according to the present invention, a high quality zinc oxide film can be produced by controlling the highest magnetic flux density on the surface of the target in a direction parallel to the surface of the target so as not to exceed 350 gauss. Additionally, according to the invention, it is possible to obtain a zinc oxide film having a high light transmittance without adding any other element. A zinc oxide film obtained by a method according to the invention has an appropriate specific electric resistance.

Still additionally, a method for forming a zinc oxide film according to the invention provides a high deposition rate that can be sustained stably for a prolonged period of time to realize a remarkably improved productivity. Furthermore, the zinc oxide film can be made very thick with a compact apparatus.

When a zinc oxide film prepared by a method according to the invention is used for a photoelectric converter, incident light can be effectively exploited to improve the absorption of light by the semiconductor of the converter to realize a high conversion efficiency so that such a photoelectric converter can be used in a small area. Then, photoelectric converters can be produced on a continuous basis over an extended operating time so that highly reliable photoelectric converters can be manufactured at low cost. Such photoelectric converters can find potential applications in the field of power supply systems.

What is claimed is:

1. A method for depositing a zinc oxide film on a substrate held in an inert gas atmosphere by magnetron sputtering comprising: controlling the maximum magnetic flux density in a direction parallel to the surface of a zinc oxide target to be not higher than 350 gauss, wherein the zinc oxide target has a specific electrical resistance not greater than 0.1 Ω·cm, and a purity of not less than 99% by weight.

2. The method for depositing a zinc oxide film according to claim 1, including providing the ratio of the distance D between the surface of a magnet and that of the zinc oxide target to the distance L between the magnetic poles of the magnet, D/L, to be not greater than 1.0.

3. The method for depositing a zinc oxide film according to claim 1, including configuring a magnet circuit so as to generate a plurality of closed loops in a magnetic field on the surface of the zinc oxide target and reciprocatively driving the magnet circuit along the surface of the zinc oxide target.

4. An apparatus for depositing a zinc oxide film comprising a holding means holding a zinc oxide target, a container for retaining a substrate, the zinc oxide target to be shot by plasma ions for sputtering in an inert gas atmosphere in the container and a magnet circuit for generating a closed loop magnetic field on the surface of the zinc oxide target, wherein the maximum magnetic flux density in a direction parallel to the surface of the zinc oxide target is held to be not higher than 350 gauss, wherein the zinc oxide target has a specific electric resistance of not greater than 0.1 Ω·cm and a purity of not less than 99% by weight.

5. The apparatus for depositing a zinc oxide film according to claim 4, wherein the ratio of the distance D between the surface of a magnet and that of the zinc oxide target to the distance L between the magnetic poles of the magnet, D/L, is held to be not greater than 1.0.

6. The apparatus for depositing a zinc oxide film according to claim 4, wherein the magnet circuit is so configured as to produce a plurality of closed loops in the magnetic field on the surface of the zinc oxide target and the apparatus further comprises a driving part for reciprocatingly driving the magnet circuit along the surface of the zinc oxide target.

7. The apparatus for depositing a zinc oxide film according to any of claims 4 through 6, wherein the apparatus is configured as a roll-to-roll apparatus adapted to deposit a film continuously while a belt-shaped substrate is moved between rolls.

8. A method for producing a photoelectric converter device comprising depositing a zinc oxide film on a substrate held in an inert gas atmosphere by magnetron sputtering, the depositing step comprising controlling the maximum magnetic flux density in a direction parallel to the surface of a zinc oxide target to be not higher than 350 gauss, wherein the zinc oxide target has a specific electrical resistance not greater than 0.1 Ω·cm, and a purity of not less than 99% by weight.

9. The method for producing a photoelectric converter device according to claim 8, wherein the depositing step includes providing the ratio of the distance D between the surface of a magnet and that of the zinc oxide target to the distance L between the magnetic poles of the magnet, D/L, to be not greater than 1.0.

10. The method for producing a photoelectric converter device according to claim 8, wherein the depositing step includes configuring a magnet circuit so as to generate a plurality of closed loops in a magnetic field on the surface of the zinc oxide target and reciprocatively driving the magnet circuit along the surface of the zinc oxide target.

11. The method for producing a photoelectric converter device according to claim 8, further comprising the steps of forming a photoconductive layer and forming a current collecting electrode.

12. The method for producing a photoelectric converter device according to claim 11, wherein the zinc oxide film is a transparent electroconductive film of the photoelectric converter device.

* * * * *

UNITED STATES PATENT AND TRADEMARK OFFICE
CERTIFICATE OF CORRECTION

PATENT NO. : 6,136,162

DATED : October 24, 2000

INVENTOR(S) : ATSUSHI SHIOZAKI ET AL.　　　　　　　　Page 1 of 2

It is certified that error appears in the above-identified patent and that said Letters Patent is hereby corrected as shown below:

COLUMN 2

Line 55, "maxium" should read --maximum--;

COLUMN 3

Line 38, "apparatus" should read --an apparatus--;
   Line 42, "cross sectional" should read --cross-sectional--;
   Line 53, "apparatus" should read --an apparatus--;

COLUMN 8

Line 17, "spectro" should read --spectro---;
   Line 31, "aqueous" should read --an aqueous--;
   Line 49, "the conditions" should read --conditions the--;
   Line 56, "the its" should read --its--;

COLUMN 9

Line 44, "micro" should read --micro---;

UNITED STATES PATENT AND TRADEMARK OFFICE
CERTIFICATE OF CORRECTION

PATENT NO.    : 6,136,162

DATED         : October 24, 2000

INVENTOR(S) : ATSUSHI SHIOZAKI ET AL.

It is certified that error appears in the above-identified patent and that said Letters Patent is hereby corrected as shown below:

<u>COLUMN 11</u>

Line 15, "spectro-photometer" should read --spectrophotometer--;
Line 35, "word," should read --words,--;
Line 46, "same" should read --the same--;

<u>COLUMN 12</u>

Line 14, "minutes" should read --minute--.

Signed and Sealed this

First Day of May, 2001

Attest:

NICHOLAS P. GODICI

*Attesting Officer*      *Acting Director of the United States Patent and Trademark Office*